United States Patent [19]

Bui

[11] 4,443,757
[45] Apr. 17, 1984

[54] MULTIPLEXED ELECTRICAL SIGNAL PROCESSOR

[75] Inventor: Ngoc C. Bui, Neuchatel, Switzerland

[73] Assignee: Asulab, S.A., Switzerland

[21] Appl. No.: 305,277

[22] Filed: Sep. 24, 1981

[30] Foreign Application Priority Data

Oct. 1, 1980 [CH] Switzerland .................. 7329/80

[51] Int. Cl.³ ............................................ G01R 23/16
[52] U.S. Cl. .................................. 324/77 B; 324/77 E
[58] Field of Search ................ 324/77 D, 77 E, 78 F, 324/79 R, 79 D; 328/167; 330/51, 107; 307/520; 333/173

[56] References Cited

U.S. PATENT DOCUMENTS

| | | | |
|---|---|---|---|
| 3,466,431 | 9/1969 | Fuchs et al. ..................... | 324/77 E |
| 4,179,665 | 12/1979 | Gregorian ........................ | 333/173 |
| 4,306,197 | 12/1981 | Gregorian ........................ | 330/107 |

Primary Examiner—Michael J. Tokar
Attorney, Agent, or Firm—Allegretti, Newitt, Witcoff & McAndrews, Ltd.

[57] ABSTRACT

A multiplexed filter with n channels comprises at least one amplifier $G_2$ with n feedback capacitors $C_5$ to $C_8$ associated with the switches $S_5$ to $S_8$. A switch-controlled resistance $R_2$ ($C'_r$, $K_5$, $K_6$, $K_7$, $K_8$) is connected to its input. Switching signals $\phi_i$ and $\phi_p$ out of phase with each other are supplied to the switches $K_5$ to $K_8$ while the multiplexing signals $\phi_1$ to $\phi_4$ are applied to the switches $S_5$ to $S_8$. The signal $\phi_1$ has a period $T_1$ and the signals $\phi_2$ to $\phi_4$ have periods $T_i = 2^{(i-1)}T_1$ where $i = 2$ to 4. The period $T_1$ is twice the period of $\phi_i$ and $\phi_p$ and the time intervals of all of $T_1$ to $T_4$ are equal to the period of $\phi_i$ and $\phi_p$. This filter with n band pass ranges (n=4 in this example) can serve with advantage for the frequency analysis of an electrical signal delivered by a microphone.

10 Claims, 17 Drawing Figures

MULTIPLEXED ELECTRICAL SIGNAL PROCESSOR

BACKGROUND OF THE INVENTION

The present invention relates to a multiplexed electrical signal processor having a plurality of processing channels, for example a multiplexed multi-channel filter unit in which resistances are replaced by switch-controlled capacitors which form electrical charge-carrying components.

Numerous systems exist in which devices for analyzing the frequency spectrum of an electrical signal are used. This is the case in circuits which analyze speech signals. These circuits may, in particular, be employed in systems which are directly controlled by speech. It therefore is necessary that the apparatus should be capable of identifying spoken instructions given to it for controlling the different functions performed by this apparatus. However, the signal processor according to the invention is in no way limited to the application for analyzing speech signals.

As has already been indicated, the invention is concerned with a processor which makes use of switch-controlled capacitors as the equivalent of resistances. This technique is well known per se and has the advantage that it renders the integration of the circuit as a whole easier than it would be when using resistances. It will be helpful nevertheless to describe briefly the principle of operation of such switch-controlled capacitors. For this purpose, reference will be made to FIGS 1a and 1b.

FIG. 1a shows a capacitor $C'$ connected between earth and the point which is common to two switches $L_1$ and $L_2$. The switches $L_1$ and $L_2$ are connected respectively to voltage sources $V_1$ and $V_2$. FIG. 1b shows the periodic logical control signals of the switches $L_1$ and $L_2$. The signals $f_1$ and $f_2$ are constituted by pulses of logical level 1 and period $t'$. The pulses applied to the control inputs of the switches $L_1$ and $L_2$ effect the closing of these switches. Thus, the pulse $I_1$ of the signal $f_1$, which closes the switch $L_1$ effects the charging of the capacitor $C'$ to the voltage $V_1$ and the pulse $I_2$ of the signal $f_2$ effects the discharge of the capacitor $C'$ to the voltage source $V_2$. At this instant the signal $f_1$ is at the level 0, so the switch $L_1$ is open. On the average, during the interval $t'$ which separates two successive pulses $I_1$ or two successive pulses $I_2$ the circuit acts as if a resistance R equal to $t'/C'$ had been connected between the voltage sources. It can be seen, therefore, that this equivalent resistance depends both on the value of the capacitor $C'$ and on the period $t'$ of control of the switches $L_1$ and $L_2$.

Known multiplexed multi-channel filters use as the basic circuit an amplifier with a plurality of switched electrical charge-storing feedback capacitors connected in parallel and a plurality of charge-transferring capacitors, constituting the equivalent of filter resistances, which are connected to the input of the amplifier and are controlled by multiplexing and switching signals. Each charge-storing feedback capacitor defines a filter channel. The multiplexing signals control sequentially the charging and discharging of the charge-storing capacitor. The time constant associated with each filter channel depends on the relationship between the values of the charge-storing capacitor and of the charge-transferring capacitor corresponding to that channel and of the period of time elapsing between the two control pulses corresponding to one and the same storage capacitor.

FIG. 2 shows a time diagram of the multiplexing signals of a multichannel multiplexed filter according to the prior art. The multiplexing signals $A_1$, $A_2$, $A_3$, $A_4$, controlling the switches associated with the various different charge-storing capacitors all have the same period T and their pulses of logical level 1 ($J_1$, $J_2$, $J_3$, $J_4$) are phase-shifted one with respect to one another. Such a multi-channel multiplexed circuit has two major disadvantages. On the one hand, it leads to excessive current consumption by the operational amplifiers associated with the filter circuit and on the other hand it necessitates the use of capacitors which can have very high values. The first disadvantage is due to the fact that the current consumption of the operational amplifiers is directly proportional to their working frequency. FIG. 2 shows that, if there are n switching signals $A_1$ to $A_4$ (n=4), n control pulses will appear during the period T. If $F=1/T$ is the frequency of the signal $A_1$, the amplifier operates at a frequency $n \times F$.

The other disadvantage is due to the fact that the time constant associated with each filter channel depends on the period T of the control signal of the channel in question and on the relationship of the capacitors corresponding respectively to the charge-transferring capacitor and the charge-storing capacitor of the filter channel in question. Since the period T is the same for all the channels, it is easy to understand that, for certain time constants, it will be necessary to use high value capacitors in order to obtain the desired relationship of the capacitors.

The object of the present invention is to provide a multiplexed signal processor which alleviates the disadvantages referred to above.

BRIEF SUMMARY OF THE INVENTION

According to the present invention, there is provided an n-channel multiplexed electrical signal processor comprising a first amplifier, a plurality n of feedback circuits connected in parallel, each including a capacitor and a multiplexing switch in series, a first equivalent resistance connected to the input of the amplifier and comprising a charge-transferring capacitor and further switches controlling the transfer of charge, and a source of period multiplexing signals controlling the multiplexing switches and periodic switching signals controlling the said further switches, a first one of the multiplexing signals having a shorter period than the other multiplexing signals whose periods and phases are such that, between successive active levels of the first multiplexing signal there is at most one active level of any other multiplexing signal, and each switching signal having an active level during every active level of all the multiplexing signals.

If the frequency of the first multiplexing signal is $F'$, the frequency at which the amplifier operates is equal to only $2 \times F'$ since, between two successive active levels of the first signal there occurs at most one active level of any of the other multiplexing signals.

The processor may, in particular, be embodied in a multichannel filter circuit.

The invention is furthermore concerned with an analyzing apparatus which comprises not only one or more multiplexing filter stages, but also a multiplexing circuit which rectifies and smooths the signal supplied by the filter stage or stages and a circuit for comparing the signals from the rectifying and smoothing circuit with a threshold, this comparing circuit also being multiplexed.

BRIEF DESCRIPTION OF THE DRAWINGS

The invention will be described in more detail, by way of example, with reference to the accompanying drawings, in which:

FIG. 5a is a block diagram of an illustrative multiplexed filter circuit having eight filter channels embodying the invention, FIG. 5b showing in detail the arrangement of a filter sub-assembly of the circuit of FIG. 5a.

FIG. 6 is a graphical representation of the frequency bands passed by the filtering circuit shown in FIG. 5a.

FIGS. 7a and 7b are diagrams of the control signals of two sub-assemblies of the filter of FIG. 5a.

FIG. 8 shows a circuit for producing the control signals for the filter according to FIG. 5a.

DETAILED DESCRIPTION OF THE PREFERRED EMBODIMENTS

Figure 1A:
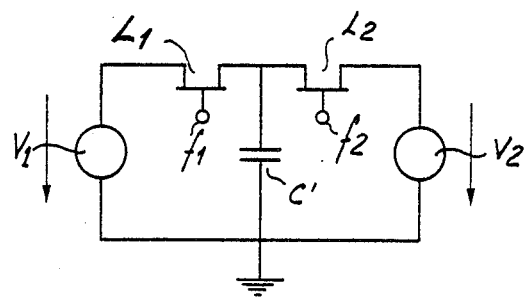
FIGS. 1a and 1b, already described, are diagrams of a switch-controlled capacitor equivalent to a resistance and of the control signals of this switch-controlled capacitor.
Figure 1B:
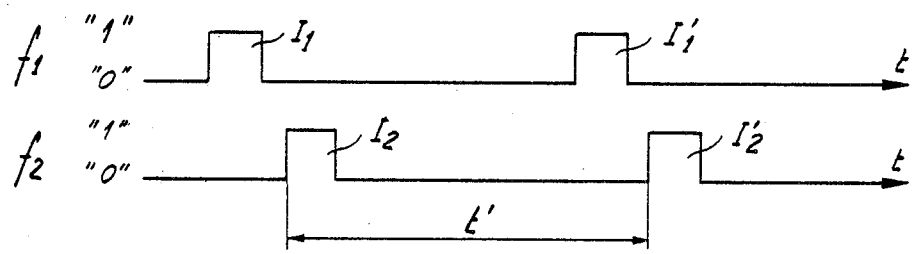
Figure 2:
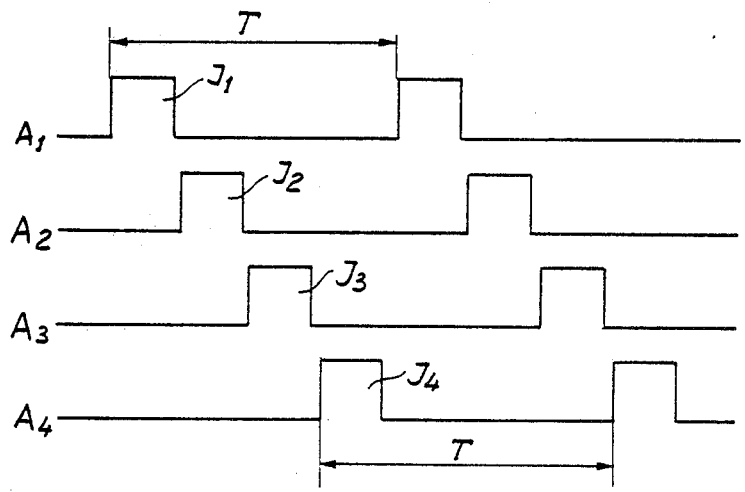
FIG. 2, already described, is a diagram of multiplexed signals of a multi-channel filter which is multiplexed according to the prior art.
Figure 3:
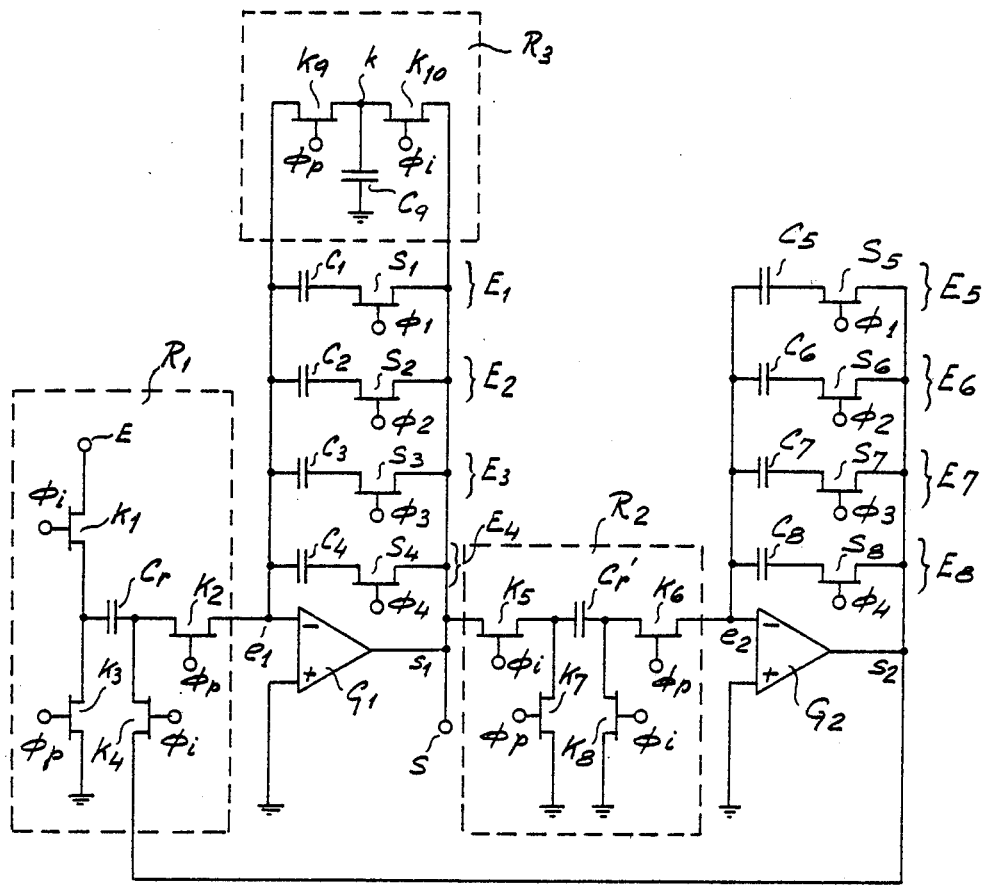
FIG. 3 is a diagram of an illustrative multiplexed filter having four channels embodying the invention.

FIG. 3 shows one embodiment of a multiplexing filter circuit having a single stage and four filter channels. This circuit comprises a first amplifier $G_1$ having an input $e_1$ and an output $s_1$. Connected between this input and output are a switch-controlled feedback capacitor bearing the general reference $R_3$, which constitutes a component for transferring electrical charge, and four filtering elements $E_1$ to $E_4$ which are all of the same nature. These five elements are connected in parallel. The element $R_3$ is constituted by a charge-transferring capacitor $C_q$ connected between earth and the point k which is common to two switches $K_9$ and $K_{10}$ constituted for example by MOS-transistors. The element $R_3$ thus reproduces exactly the circuit shown in FIG. 1. Each of the filter elements $E_1$ to $E_4$ is comprised of a charge-storing capacitor $C_1$ to $C_4$ and a multiplexing switch $S_1$ to $S_4$. These switches comprise, for example, MOS transistors.

The inventive apparatus also comprises a second amplifier $G_2$ having an input $e_2$ and an output $s_2$. Connected in parallel with each other between the input $e_2$ and the output $s_2$ are the filtering feedback units $E_5$ to $E_8$. Each of these units is comprised of a charge-storing capacitor $C_5$ to $C_8$ and a switch $S_5$ to $S_8$. In other words, the elements $E_5$ to $E_8$ are of exactly the same construction as the elements $E_1$ to $E_4$ and the capacitors $C_5$ to $C_8$ are the same as the capacitors $C_1$ to $C_4$, respectively.

The input $e_1$ of the amplifier $G_1$ is connected to the input E of the filter circuit through a switch-controlled capacitor $R_1$ which forms a charge-transferring component. This unit $R_1$ is comprised of a charge-transferring capacitor $C_r$ which is connected to the input E via a switch $K_1$ and to the input $e_1$ of the amplifier $G_1$ via a switch $K_2$. In addition, the two electrodes of the capacitor $C_r$ are connected respectively to earth via a switch $K_3$ and to the output $s_2$ of the amplifier $G_2$ via a switch $K_4$. Moreover, the output $s_1$ of the amplifier $G_1$ is connected to the input $e_2$ of the amplifier $G_2$ via a switch-controlled capacitor $R_2$. This unit $R_2$ is comprised of a capacitor $C'_r$ connected on the one hand to the output $s_1$ of the amplifier $G_1$ via a switch $K_5$ and on the other hand to the input $e_2$ of the amplifier $G_2$ via a switch $K_6$. Furthermore, one of the electrodes of the capacitor $C'_r$ is connected to earth via a switch $K_7$, while the other electrode of this same capacitor is connected to earth via a switch $K_8$. The capacitors $C_r$ and $C'_r$ are identical. The output $s_1$ of the amplifier $G_1$ forms the output S of the filter circuit.

It must be noted that the unit $R_2$ consists of a switch-controlled capacitor of a rather special type. The four contact-breaking switches $K_5$, $K_6$, $K_7$, and $K_8$ so connected make it possible to charge the electrode of the transfer capacitor $C'_r$ which is connected to earth. The effect of parasitic capacitances between the electrodes of $C'_r$ and earth during the switching over of the capacitor is thus eliminated. Likewise, in the unit $R_1$, the capacitor $C_r$ and the switches $K_1$, $K_2$ and $K_3$ have the same function as the capacitor $C'_r$ and the switches $K_5$, $K_6$ and $K_7$. The switch $K_4$ serves for connecting the output $s_2$ of the amplifier $G_2$ to the input of the amplifier $G_1$. This switch with its capacitor thus operates as the equivalent of an adder in a control loop.

Figure 4:
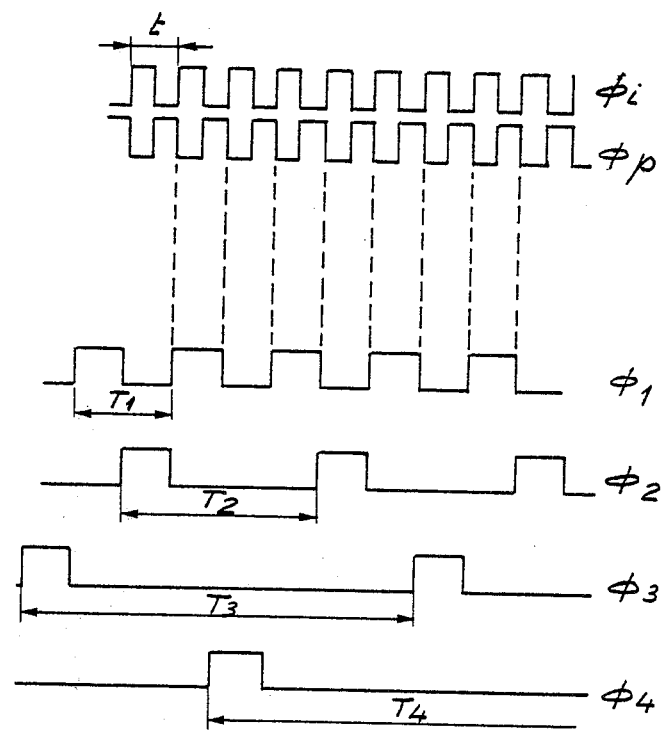
FIG. 4 is a diagram of control signals of the filter circuit shown in FIG. 3.

The operation of this circuit is as follows:

It is assumed first of all that the switches $S_2$ to $S_4$ and $S_6$ to $S_8$ are open, whereas the switches $S_1$ and $S_5$ are closed. Furthermore, the signals $\phi_i$ and $\phi_p$ shown in FIG. 4 are applied respectively on the one hand to the switches $K_1$, $K_4$, $K_5$, $K_8$ and $K_{10}$ and on the other hand to the switches $K_2$, $K_3$, $K_6$, $K_7$ and $K_9$. The circuit then operates as a band-pass filter with a single channel the transfer function of which, expressed in terms of the frequency (f), obeys the following equation:

$$T(f) = \frac{A}{\sqrt{1 + Q^2(f/f_o - f_o/f)^2}}$$

in which Q represents the quality factor, $f_o$ the tuned frequency and A the gain of the filter.

The tuned frequency of this elementary filter is defined by the ratio of the value of the capacitor $C_r$ to the value of the capacitor $C_1$ and by the period t of closing of the switches $K_1$ to $K_{10}$ associated with the switch-controlled capacitors, that is to say the period of the signals $\phi_1$ and $\phi_p$.

The quality factor Q is defined by the ratio of the values of the capacitors $C_r$ and $C_q$.

Of course, if only the switches $S_2$, $S_6$ or $S_3$, $S_7$ or again $S_4$, $S_8$ were closed, the same manner of functioning would be obtained, but with tuned frequencies differing in each case in accordance with the values of the capacitors $C_2$, $C_3$, and $C_4$.

If now the multiplexing signals $\phi_1$, $\phi_2$, $\phi_3$ and $\phi_4$ shown in FIG. 4 are applied respectively to the groups of switches $S_1$-$S_5$, $S_2$-$S_6$, $S_3$-$S_7$ and $S_4$-$S_8$, a multiplexed operation of the circuit is obtained, thus defining four band-pass filter channels, corresponding to the groups of capacitors $C_1$ and $C_5$, $C_2$ and $C_6$, $C_3$ and $C_7$ and $C_4$ and $C_8$.

As shown by FIG. 4, the signal $\phi_1$ is constituted by a series of periodic pulses of logical level 1 separated by signal portions at the logical level 0. These switches $S_i$ (i=1 to 8) are such that, when a signal of logical level 1 is applied to their control inputs, these switches are closed, that is to say they allow the current to pass. For the logical level 0, these same switches are of course open. In the course of the description, the logical level of the signal which causes the switch to close will be referred to as the "active level" (level 1 in the example) and the logical level which causes the switch to open will be referred to as "inactive" (level 0 in the example). The switches $S_i$ constituted for example by MOS transistors controlled by their gate electrodes.

The signal $\phi_1$ has a period $T_1$. The signal $\phi_2$ has a period $T_2 = 2T_1$, the signal $\phi_3$ has a period $T_3 = 4T_1 (= 2^2 T_1)$ and the signal $\phi_4$ has a period $T_4 = 8T_1 (= 2^3 T_1)$. In addition, as shown in FIG. 4, the signals $\phi_2$ to $\phi_4$ are phase-displaced with respect to signals $\phi_1$ and $\phi_4$ wll appear between two successive pulses of the signal $\phi_1$. Thus, at each instant one signal at most has an active level. Moreover, the antiphase signals $\phi_i$ and $\phi_p$ have a period equal to $\frac{1}{2}T_1$ and each of the signals $\phi_i$ and $\phi_p$ has one pulse for each active level of the signals $\phi_1$ to $\phi_4$. The capacitors $C_r$ and $C_q$ are accordingly charged and discharged during each active state of each multiplexing signal $\phi_1$ to $\phi_4$.

During each pulse of the signal $\phi_1$ the signal appearing at the output S of the circuit corresponds to the portion of the signal contained in the band-pass range defined by the capacitor $C_1$. More specifically, if $C_q$ is so chosen that $C_q = C_r/Q$ (Q being the quality factor common to all the channels) the equivalent time constant is $C_1/C_r T_1$. For the three other channels, the equivalent time constants are $C_2/C_r T_2$; $C_3/C_r T_3$ and $C_4/C_r T_4$. In a specific example the four band-pass ranges are distant from one another by one octave. To this end the capacitors $C_1$ to $C_4$ are equal since the corresponding periods $T_1$, $T_2 \ldots T_4$ are all in a 2:1 relationship. The quality factor clearly remains the same for all the filter channels.

Moreover, it is clear that, between two successive active levels of the signal $\phi_1$, there is only one active level of the other signals taken as a whole with the exception of instants which correspond to the periods $T_4 \times 2^n$, for n>3, where there is no active level. Consequently, the amplifiers $G_1$ and $G_2$ operate only with the period $\frac{1}{2}T_1$, which reduces their consumption.

Finally, in order to define the time constants of the various different channels, it is possible to take advantage of the value of two parameters: the value of the period $T_i$ of the multiplexed signal and the value of the capacitor $C_i$. It is thus possible to keep the values of the capacitors within reasonable limits.

More generally, if the circuit contains n filter channels, there will be n multiplexing signals. If $\phi_1$ is the signal the period $T_1$ of which is shorter than those of all the other signals $\phi_2$ to $\phi_n$, the other signals will have periods and phase-displacements such that at most one pulse, that is to say at most one active level, of these signals taken as a whole will be present between two successive active levels of the signal $\phi_1$. Thus, the amplifiers $G_1$ and $G_2$ operate effectively at the maximum period $\frac{1}{2}T_1$. If the condition previously specified is observed, all combinations of the periods $T_2$ to $T_n$ are possible. They depend on the mean frequencies of the band-pass ranges to be defined. It will be possible, as in the previous example, to make use of the equations:

$$T_i = 2^{(i-1)}T_1, \text{ where } i=2 \text{ at } n.$$

It is still possible to choose, for the periods $T_2$ to $T_n$, the same value $nT_1$, the active levels of the signals $\phi_2$ to $\phi_n$ being phase-displaced with respect to $100_1$ by a period $\frac{1}{2}T_1$.

In order to enable the characteristics of the invention to be better understood, a filter circuit corresponding to the filter bands shown in FIG. 6 will be described in conjunction with FIGS. 5a and 5b. The characteristic values of the eight filter channels are summarized in the following table:

| | $f_o$(Hz) | $f_L$(Hz) | $f_H$(Hz) | B(Hz) | Q = $f_o$/B |
|---|---|---|---|---|---|
| a | 106 | 75 | 150 | 75 | 1.41 |
| b | 212 | 150 | 300 | 150 | 1.41 |
| c | 377 | 300 | 475 | 175 | 2.15 |
| d | 600 | 475 | 756 | 281 | 2.15 |
| e | 952 | 756 | 1200 | 444 | 2.15 |
| f | 1512 | 1200 | 1905 | 705 | 2.15 |
| g | 2400 | 1905 | 3024 | 1119 | 2.15 |
| h | 3810 | 3024 | 4800 | 1776 | 2.15 |

In this table $f_o$ is the mid frequency; $f_L$ and $f_H$ are the upper and lower corner frequencies at $-3$ dB; B is the $-3$ dB band width; and Q is the quality factor.

It will be seen that the two filter channels of lowest frequency (a, b) are octave filters, while the six other filter channels are $\frac{2}{3}$ octave filters. It is also required that the response curves should be flat within the band pass range and should have a cut-off of 40 dB per decade outside the band pass range.

In order to fulfill the condition of cut-off at 40 dB per decade, the circuit is constituted by two filter stages connected in cascade and each providing a cut-off of 20 dB per decade. In other words, the overall transfer function T'(f) is the product of the following transfer functions:

$$T_1(f) = \frac{A_1}{\sqrt{1 + \alpha^2 Q^2 (f/\beta f_o - \beta f_o/f)^2}}$$

and $$T_2(f) = \frac{A_2}{\sqrt{1 + \alpha^2 Q^2 (\beta f/f_o - f_o/\beta f)^2}}$$

where $\alpha$ and $\beta$ are the coefficients which have values of 1.46 and 1.29 respectively for octave filters and of 1.43 and 1.18 respectively for $\frac{2}{3}$ octave filters. Moreover, the overall gain A is equal to j $A_1 A_2$ and the coefficient j is equal to 0.47 for an octave filter and to 0.49 for a $\frac{2}{3}$ octave filter.

Figure 5A:
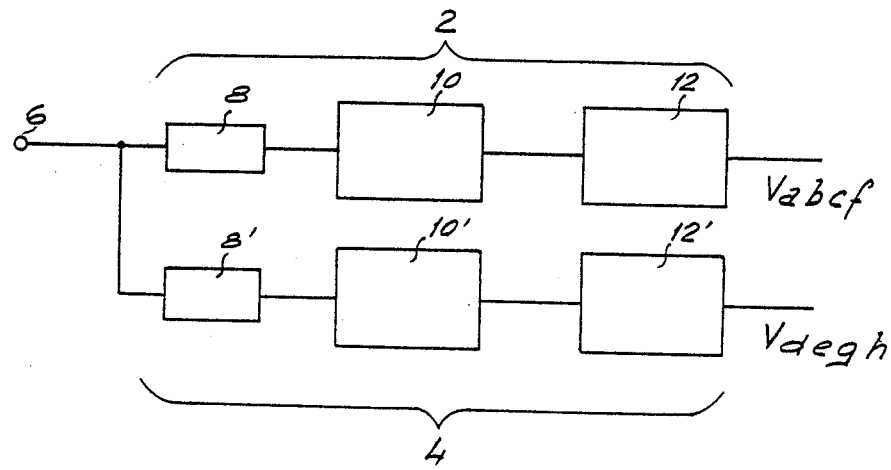
Figure 5B:
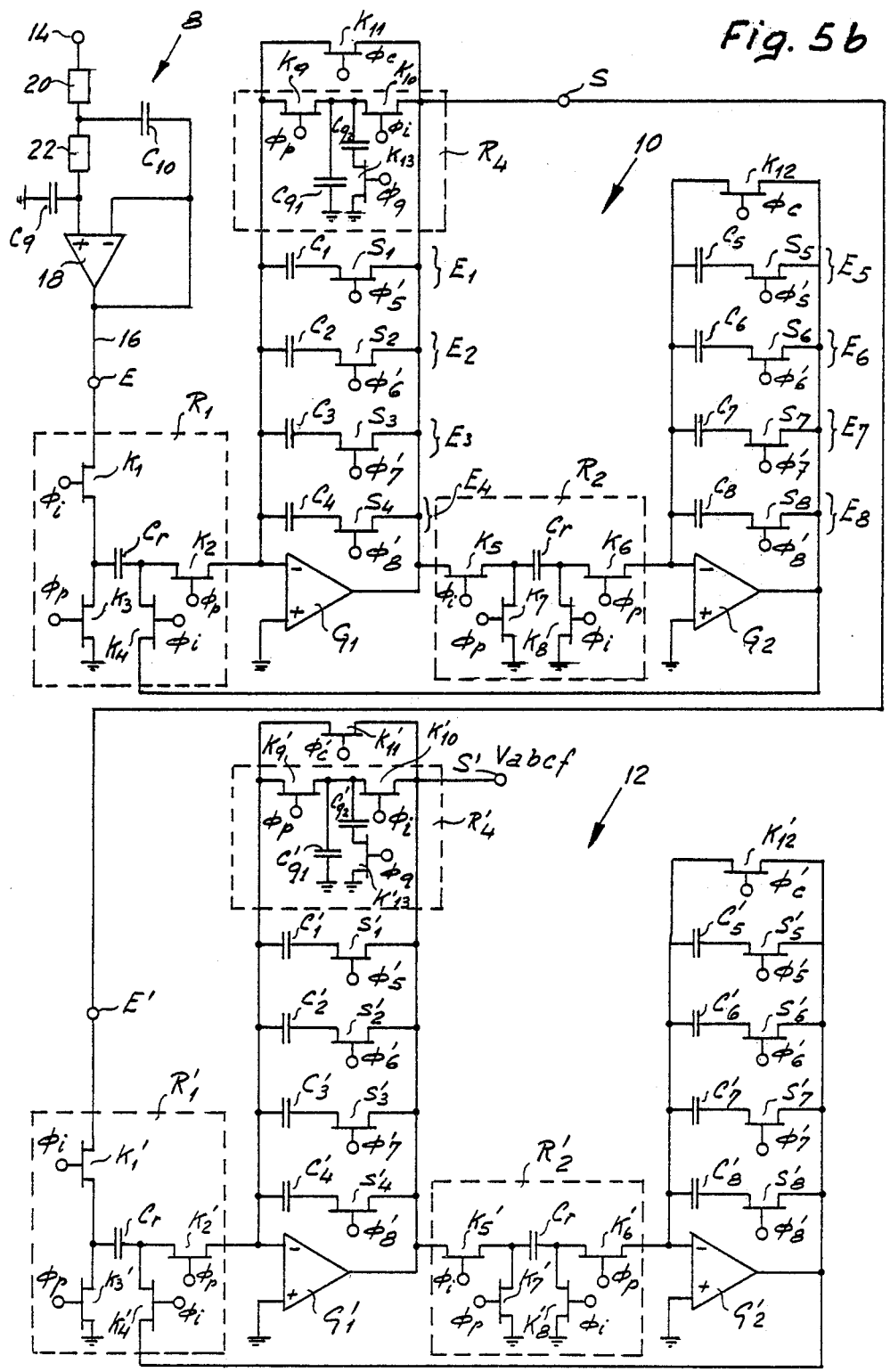
Figure 6:
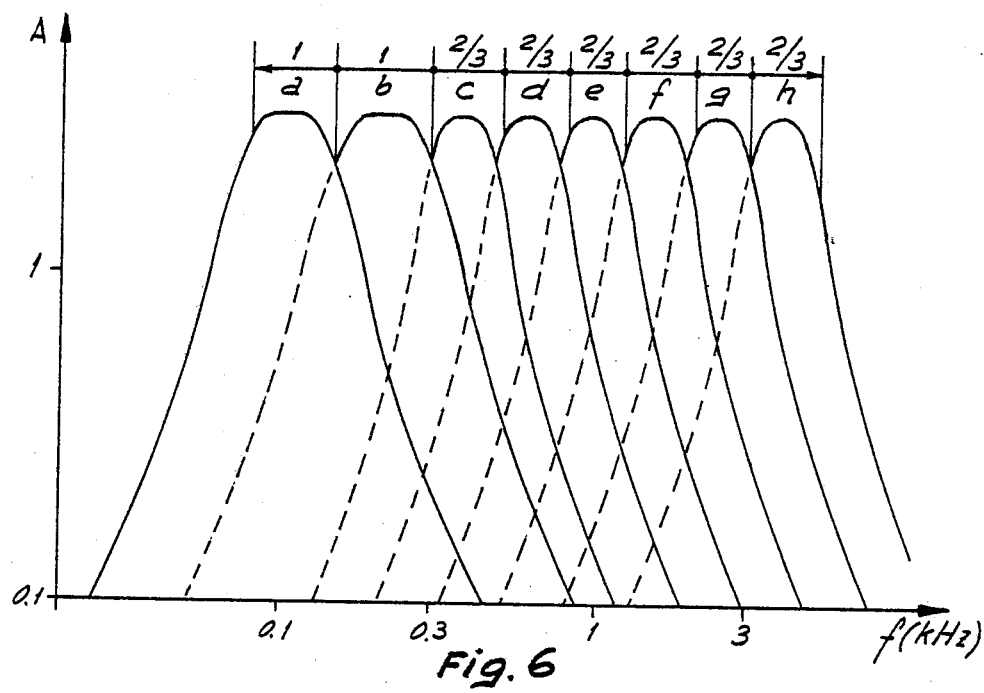

Having regard to the fact that there are octave filters and $\frac{2}{3}$ octave filters, it is preferable to produce the complete filter circuit as two sub-assemblies indicated by the references 2 and 4 in FIG. 5a. The sub-assembly 2 provides the band pass ranges a, b, c, and f and the sub-assembly 4 the band pass ranges d, e, g, and h. The purpose of this sub-division is merely to simplify the circuit, but this in no way alters the principle of the invention. Except for details, the sub-assemblies 2 and 4 are identical and in fact they differ mainly in the values of capacitance corresponding to the several different band-pass ranges. This is why only the sub-assembly 2 is shown in detail in FIG. 5b.

The sub-assemblies 2 and 4 are connected in parallel after the common input 6. Each sub-assembly comprises a preliminary filtering stage 8 and 8', a first filter stage 10 and 10' and a second filter stage 12 and 12'. The usefulness of two filter stages has already been explained.

The construction of the two filter stages 10 and 12 is identical. Only the capacitances of the capacitors differ from stage 10 to stage 12. Moreover, each of these stages differs very little from the circuit shown in FIG. 3. This is why the references used in FIG. 3 have been used again for the parts that are common to both figures. For the second stage 12 the references used for the stage 10 are used again, but with the addition of a "prime" suffix.

The preliminary filter 8 is a low-pass filter the cut-off frequency of which is 2.4 kHz. It serves for eliminating undesirable frequencies. It comprises, between its input 14 which is connected to the inputt 6 of the circuit and its output 16 which is connected to the input E of the stage 10, an amplifier 18 the output of which is connected to its inverted input, resistors 20 and 22 connected in series between the input 14 and the direct input of the amplifier 18, a capacitor $C_9$ connected between earth and the direct input of the amplifier and a capacitor $C_{10}$ connected between the point which is common to the resistors 20 and 22 and the inverted input of the amplifier 18.

The stage 10, like the circuit of FIG. 3, comprises the amplifiers $G_1$ and $G_2$, the switch-controlled resistances $R_1$ and $R_2$ and the filter elements $E_1$ to $E_8$. It also comprises switches $K_{11}$ and $K_{12}$ which are connected in parallel with the filter elements $E_1$ to $E_4$ and $E_5$ to $E_8$ respectively and serve for resetting to zero the outputs of the amplifiers $G_1$ and $G_2$ respectively with the aid of a signal $\phi_C$ as will be explained later.

The amplifier $G_1$ also has a feedback switch-controlled capacitor unit $R_4$ which replaces the switch-controlled capacitor unit $R_3$ of FIG. 3. This unit $R_4$ includes a capacitor $C_{q1}$ connected between earth and the point which is common to the switches $K_9$ and $K_{10}$. It also includes a capacitor $C_{q2}$ which is connected between the common point and a switch $K_{13}$ which is itself connected to earth. This circuit $R_4$ constitutes a switch-controlled capacitor unit, but with the feature that it can assume two different values. When the switch $K_{13}$ is opened by the signal $\phi_Q$, only the capacitor $C_{q1}$ is switched in. When the switch $K_{13}$ is closed by the signal $\phi_q$, the two capacitors $C_{q1}$ and $C_{q2}$ are connected in parallel. These two values of the capacitance of the switch-controlled capacitor unit $R_4$ are made necessary by the fact that, as indicated by the table, the quality factor Q is different for the bands a and b and for the bands c and f.

The input E' of the stage 12 is connected to the output S of the stage 10. At the output S' there appears the output signal $V_{abcf}$ which includes the portions of the input signal that correspond to the frequency bands, a, b, c, and f. In order to produce the four band-pass ranges a, b, c, and f, the filter capacitors have the following values;

$C_1 = C_5 = 4.46pF;\ C_2 = C_6 = 8.92pF;$
$C_3 = C_4 = C_7 = C_8 = 7.24pF;\ C'_1 = C'_5 = 6.22pF;$
$C'_2 = C'_6 = 12.5pF;\ C'_3 = C'_4 = C'_7 = C'_8 = 12.1pF.$

The switch-controlled capacitors have the following values:

$C_r = C'_r = 2pF;\ C_{q1} = C'_{q1} = 0.65pF;$
$C_{q2} = C'_{q2} = 0.32pF.$

For the preliminary filter, the resistors 20 and 22 are equal to 10 MΩ and the capacitors $C_9$ and $C_{10}$ have values of 9.38 pF and 4.69 pF respectively.

In the sub-assembly 4, the preliminary filter 8' is constituted by a low-pass preliminary filter the cut-off frequency of which is 6 kHz. This preliminary filter is of the same construction as the preliminary filter 8. Only the values of the capacitances of the capacitors are different. $C_9$ has a value of 1.88 pF and $C_{10}$ a value of 3.75 pF.

The first filter stage 10' of the sub-assembly 4 is identical with the stage 10 of the sub-assembly 2, except for the fact that the unit $R_4$ contains only the capacitor $C_{q1}$. It is thus identical with the unit $R_3$ of FIG. 3 and $C_{q1}$ is equal to 0.65 pF. Thus, for the frequency bands d, e, g, h, the quality factor Q is the same. As for the second stage 12', it is identical with the stage 10'. In this sub-assembly, the value of the capacitor $C_r$ is always 2 pF and those of the other capacitors are:

$C_1 = C_3 = C_5 = C_7 = 7.06pF,$
$C_2 = C_6 = C_8 = 9.86pF = C_4$ $C'_1 = C'_3 = C'_5 = C'_7 = 5.6pF;$
$C'_2 = C'_4 = C'_6 = C'_8 = 7.84.$

When conveniently choosing the values of the capacitances of the capacitors $C_1$ to $C_4$ respectively for the first filter stages 10 and 10', the frequencies of the multiplexing signals may be chosen in the following manner in order to obtain effectively the band pass ranges which have the disposition shown in FIG. 6:

$\phi'_8$ (channel a) = 3.125 kHz. $\phi'_7$ (channel b) = 6.25 kHz.

$\phi'_6$ (channel c) = 12.5 kHz. $\phi'_5$ (channel f) = 25 kHz.

These signals control the sub-assembly 2.

For the sub-assembly 4, the multiplexing signals are:

$\phi'_4 = 12.5$ kHz (channel d) $\phi'_3 = 25$ kHz (channel e)

$\phi'_2 = 50$ kHz (channel g) $\phi'_1 = 100$ kHz (channel h)

Figure 7A:
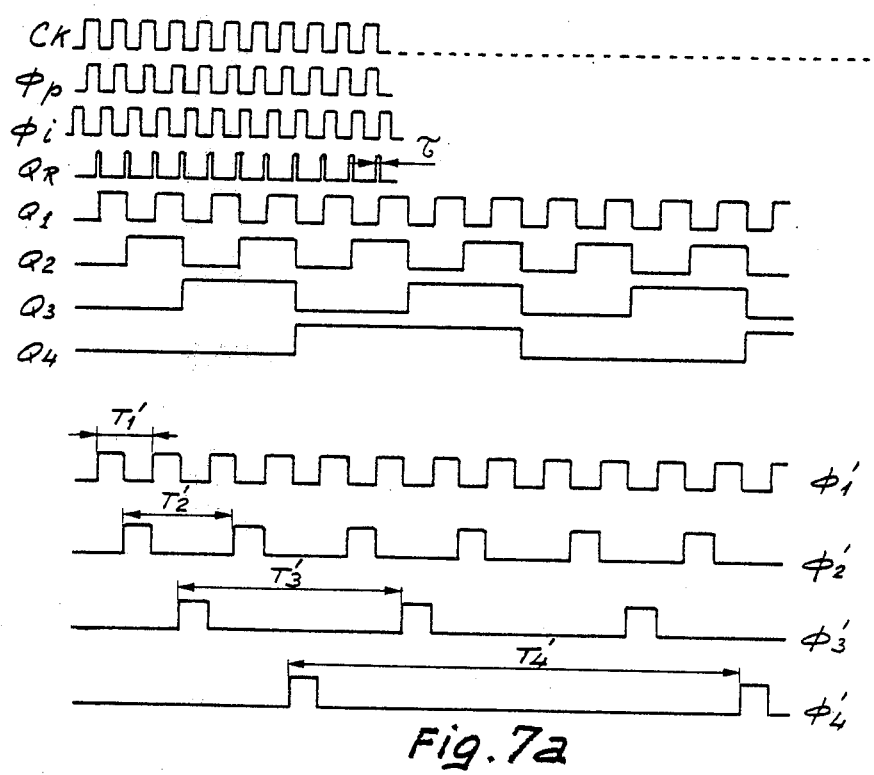
Figure 7B:
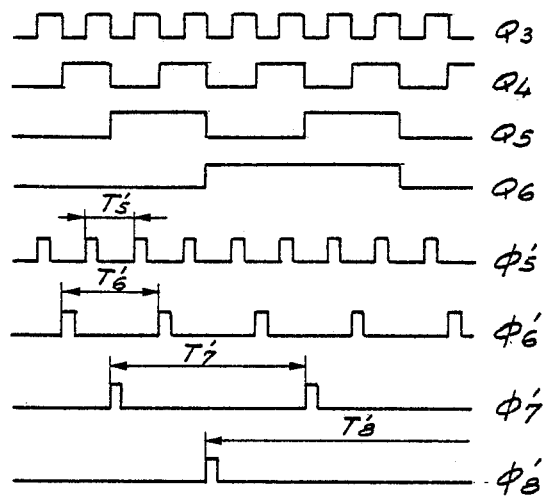

Their periods are indicated by reference $T'_8$ to $T'_1$ respectively in FIGS 7a and 7b.

The values of the frequencies of the multiplexing signals show that the signals $\phi'_3$ and $\phi'_5$ as well as $\phi'_4$ and $\phi'_6$ are identical. This does not disturb the operation of the circuit as a whole since there are two independent multiplexings for the sub-assembly 2 and the sub-assembly 4 respectively.

The apportionment of the channels a to h between the sub-assemblies 2 and 4 has been effected as previously described solely in order to simplify the embodiment.

Figure 8:
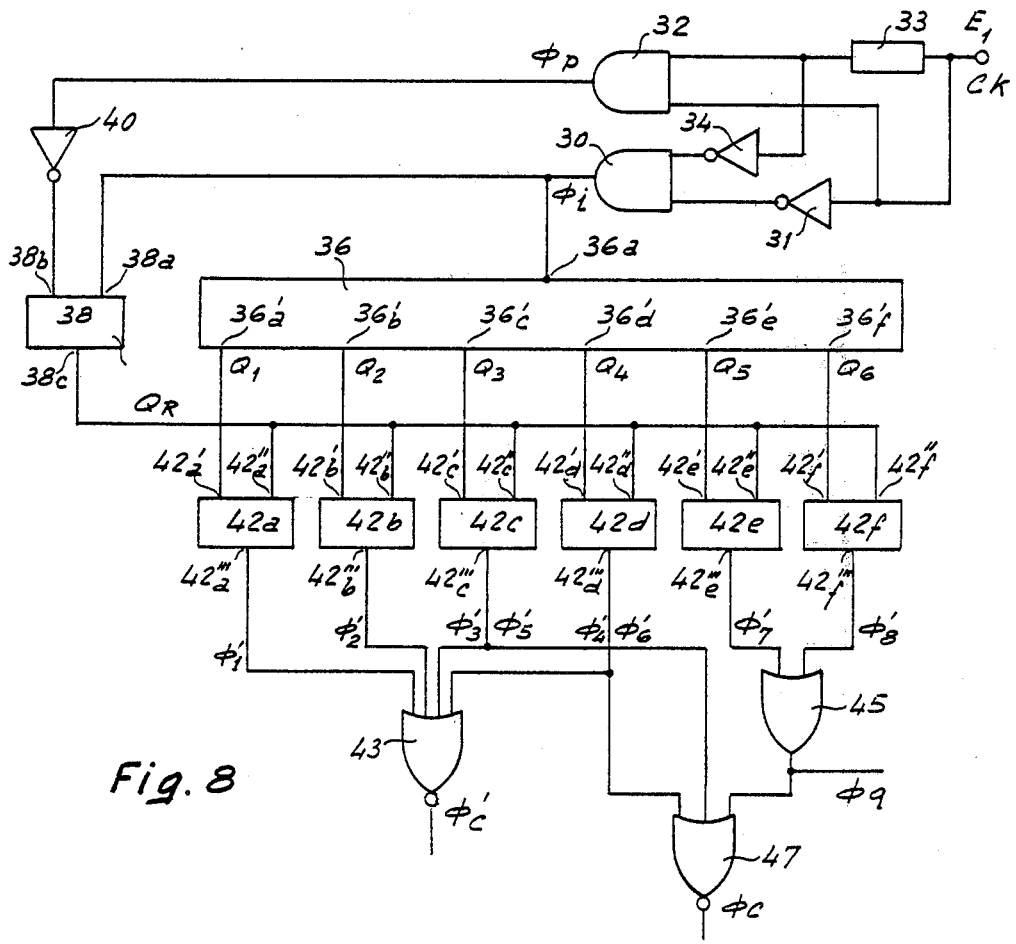

FIG. 8 provides an illustrative embodiment of a unit for producing the signals $\phi'_1$ to $\phi'_8$.

The input terminal $E_1$ of this circuit is connected to one input of an AND gate 30 via an inverter 31, to one input of an AND gate 32, and to a circuit 33 which imparts a delay $\tau$ to the rising and falling edges of the clock signal applied to its input. The output of the delay circuit 33 is connected to the second input of the AND gate 30 via an inverter 34 and to the second input of an AND gate 32. The output of the AND gate 30 is connected to the clock input 36a of a binary counter 36 and to the reset to zero input 38a of a D flip-flop 38. The output of the AND gate 32 is connected to the clock input 38b of the flip-flop 38 via an inverter 40. The binary outputs 36'a to 36'f of the counter 36 provide signals $Q_1$ to $Q_6$ which are applied at the clock inputs 42'a to 42'f of six D flip-flops which are referenced 42a to 42f. Moreover the reset-to-zero inputs 42"a to 42"f of these flip-flops are connected to the output 38c of the flip-flop 38. The outputs 42'''a to 42'''f of the flip-flops 42a to 42f provide the multiplexing signals $\phi'_1$ to $\phi'_8$, taking into account the fact $\phi'_3$ and $\phi'_5$ are identical, as are $\phi'_4$ and $\phi'_6$.

At the input $E_1$ of this circuit, a clock signal CK (FIG. 7a) of 200 kHz is applied. The gate 30 delivers at its output the signal $\phi i$ of 200 kHz which is inverted relative to the signal CK and the rising edges of which have a delay of $\tau$ in relation to the falling edges of the signal CK, the falling edges of $\phi i$ being coincident with the rising edges of CK. The gate 32 delivers the signal $\phi_p$ the rising edges of which are delayed with respect to the rising edges of CK, the falling edges of the two signals being coincident. The flip-flop 38 delivers a signal $Q_R$ the pulses of which are in phase with the falling edges of the signal $\phi_p$ and have a duration equal to $\tau$. The binary counter 36 delivers the signals $Q_1$ to $Q_6$ at its output 36'a to 36'f in a conventional manner. These signals are represented in FIGS. 7a and 7b. The outputs of the flip-flops 42a to 42f emit the signals $\phi'_1$ to $\phi'_8$. They do not differ from the signals $Q_1$ to $Q_6$ except for the fact that they are reset to zero by the pulses $Q_R$. FIG. 7a shows how the signals $\phi'_1$ to $\phi'_4$ are formed, while FIG. 7b shows how the signals $\phi'_5$ to $\phi'_8$ are formed. The change in the time scale serves merely to render FIG. 7a more easily readable.

As a result of the introduction of the delay $\tau$, all risk of overlapping of the signal $\phi_i$, $\phi_p$ and $\phi'_8$ is avoided.

FIG. 8 likewise shows the formation of the signals $\phi_C$, $\phi'_C$ and $\phi_q$. The outputs of the flip-flops 42a, 42b, 42c and 42d are connected to the inputs of a NOR gate 43, the output of which delivers the reset to zero signal $\phi'_C$ of the amplifier $G_1$ and $G_2$, $G'_1$ and $G'_2$ of the sub-assembly 4. The outputs of the flip-flops 42e and 42f are connected to the inputs of an OR gate 45. The output of the gate 45 delivers the control signal $\phi_q$ of the switches $K_{13}$ and $K'_{13}$ of the sub-assembly 2. Lastly, a NOR gate 47 receives at its inputs the outputs of the flip-flops 42c and 42d and the output of the OR gate 45. The output of the gate 47 delivers the signal $\phi_C$.

The manner in which the circuit shown in FIG. 5 functions is similar to that in the case of FIG. 3. The multiplexing signals $\phi'_5$, $\phi'_6$, $\phi'_7$ and $\phi'_8$ play the same role as the signals $\phi_1$, $\phi_2$, $\phi_3$ and $\phi_4$ in FIG. 3. In addition to this, there is only the fact that, when there is no active level of the multiplexing signal, the signal $\phi_C$ resets the output of the amplifiers of the sub-assembly 2 to zero. In the same way, the signal $\phi'_C$ resets the output of the amplifiers of the sub-assembly 4 to zero. Finally, when the multiplexing signals $\phi'_7$ and $\phi'_8$ are at an active level, the signal $\phi_q$ alters the value of the switch-controlled capacitor $R_4$ and $R'_4$ of the sub-assembly 2 so as to adjust the value of the quality factor Q.

At the output S' of the sub-assembly 12 there appears the multiplexed signal Vabcf, the successive wave forms of which represent the amplitude of the wave forms of the input signal for the filter bands, a, b, c, and f. Similarly, there appears at output S' of the sub-assembly 12' the multiplexed signal Vdegh, the successive wave forms of which represent the amplitude of the wave forms of the input signal for the filter bands d, e, g, h.

The preceding description is concerned with a complete multi-channel band-pass filter. It is evident that the invention likewise is applicable to the provision of simpler processing devices and, for example, a low-pass filter or a high-pass filter having a plurality of filter channels. It can likewise be applied to the provision of an integrator with several integration constants controlled by multiplexing signals. Indeed, in all cases, the circuit employed uses the same basic cell which consists of an amplifier including a plurality of feedback elements of the same nature in parallel and each of which comprises a switch controlled by a multiplexing signal and a capacitor, the value of which determines the action of the processing channel, and at the input of the amplifier a switch-controlled capacitor the switches of which are controlled by switching signals. The basic cell is, for example, shown in FIG. 3 with the elements counter-coupled with the amplifier $G_2$ and the switch-controlled capacitor. Of course, this assembly is controlled by switching the multiplexing signals that have the characteristics previously defined.

The filter circuit described above forms a unit which can have numerous applications. However, this circuit may be completed so as to form a complete apparatus for analyzing the signals applied to the input of the filter circuit. In the case where the complete apparatus is concerned with speech analysis, it may be desirable to add an input amplifier which amplifies the electrical signal leaving the acoustical to electrical transducer. At the output of the filter circuit, it may likewise be desirable to add circuits which treat the multiplexed signal delivered by the filter circuit. These circuits may serve to rectify and determine the mean value of the wave forms corresponding to any one channel. It may equally well serve for comparing the mean value of the signal for each channel with a reference value. It is these complementary circuits that will be described hereafter.

Figure 9A:
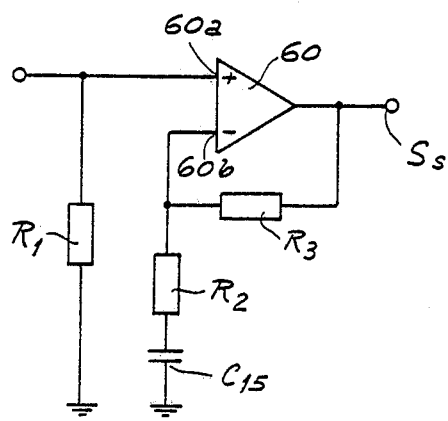
FIG. 9a shows a diagram of an illustrative amplifier, which can be used at the input of the filter in the case where a speech analyzing device is provided.
Figure 9B:
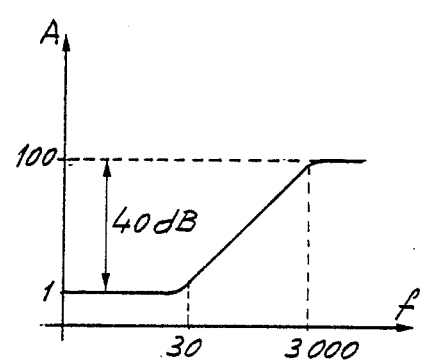
FIG. 9b shows the response curve of the amplifier.

FIG. 9a shows an input-amplifying circuit, the characteristic gain (A) of which, expressed in terms of the frequency (f) in Hertz, is shown in FIG. 9b. The circuit comprises a different amplifier 60 (for example an operational amplifier), the direct input 60a which is connected to the input $E_e$ of the circuit and the output of which is connected to the output $S_s$ of the circuit. A resistor $R_1$ is connected between earth and the direct input 60a of the amplifier 60. In addition, a feedback resistor $R_3$ is connected between the output of the amplifier and the inverting input 60b, which is connected to each through a resistor $R_2$ and capacitor $C_{15}$. If the values of the resistors $R_1$, $R_2$ and $R_3$ are 10 MΩ, 100 MΩ and 10 MΩ and if the value of the capacitor $C_{15}$ is equal to 53 pF, the amplifying circuit will produce the response curve shown in FIG. 9b. This amplifier produces a gain of about 100, which is suitable for the output of a microphone. In addition, it boosts the high frequencies up to 3 kHz, with a slope of 20 dB for each decade. This characteristic is suitable when the electrical signal applied to its input $E_e$ is representative of speech.

Figure 10A:
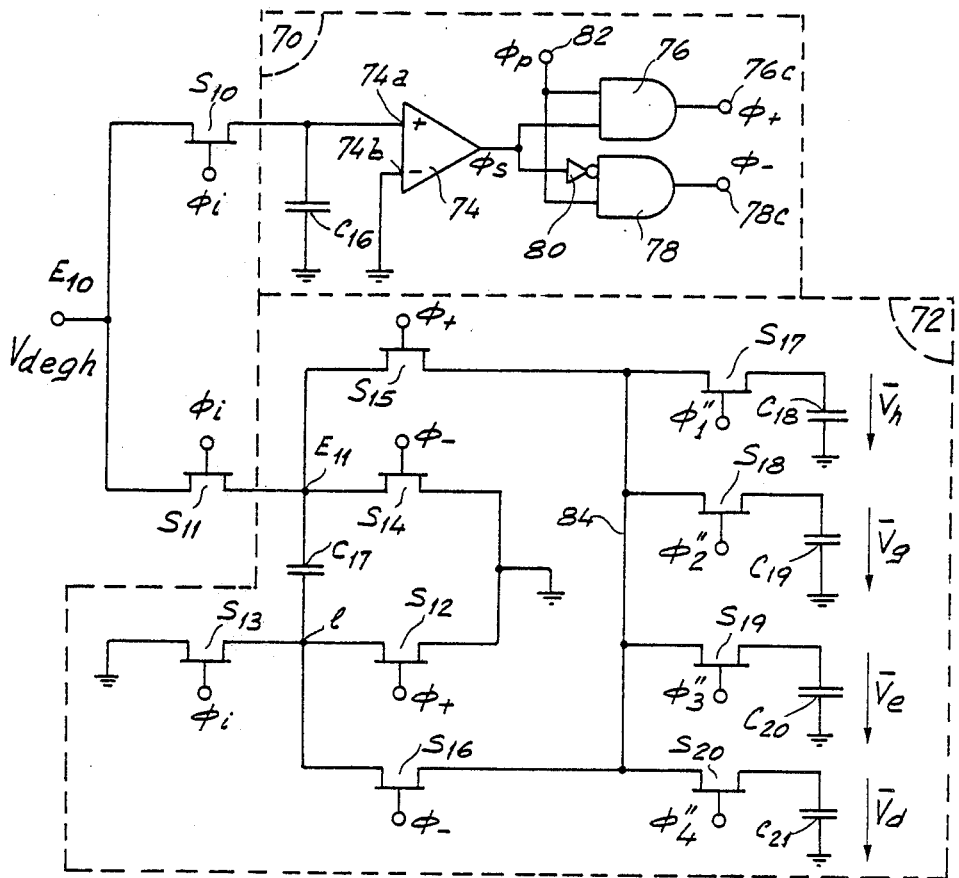
FIG. 10a shows a diagram of a rectifying circuit which also determines the mean value of the signals delivered by the filter.

The circuit shown in FIG. 10a enables signals which are representative of the mean rectified value of the wave form corresponding to the several different filter channels to be processed. In the particular case of the circuit shown in FIG. 10, it operates upon the wave forms corresponding to the filter channels d, e, h and g, that is to say the signal Vdegh.

The input $E_{10}$ is connected to a sign-detecting circuit 70 via a switch $S_{10}$ and to a detecting and smoothing circuit 72 via a switch $S_{11}$.

The circuit 70 comprises a comparator 74 the input 74a of which is connected to the swith $S_{10}$. A capacitor $C_{16}$ is connected between earth and the input 74a. The inverted input 74b of the comparator is connected directly to earth. The output of the comparator 74 is connected to an AND gate 76 and to AND gate 78 through an inverter 80. The other inputs of the AND gates 76 and 78 are connected to a control terminal 82. The signals $\phi_+$ and $\phi_-$ indicating that the signal applied to the direct input 74a of the comparator 74 is positive or negative appears at the outputs 76c and 78c respectively. The signal $\phi_p$, which has already been mentioned with reference to FIG. 5, is applied to the control input 82.

The circuit 72 includes a capacitor $C_{17}$ connected between the input $E_{11}$ and a point l. This point l can be connected to earth either by a switch $S_{12}$ or by a switch $S_{13}$. Likewise, the input $E_{11}$ can be connected to earth by a switch $S_{14}$. The points $E_{11}$ and l can be connected to the line 84 by switches $S_{15}$ and $S_{16}$ respectively. Capacitors $C_{18}$, $C_{19}$, $C_{20}$, and $C_{21}$, are connected between earth and switches $S_{17}$, $S_{18}$, $S_{19}$, and $S_{20}$ which enable these capacitors to be connected to the conductor 84. By way of example, the value of the capacitors $C_{16}$, and $C_{17}$ is 1 pF and that of the capacitors $C_{18}$ to $C_{20}$ is 10 pF.

The way in which the circuit functions will be described with reference to FIG. 10b, which represents the control signals applied to the switches $S_{10}$ to $S_{20}$.

Figure 10B:
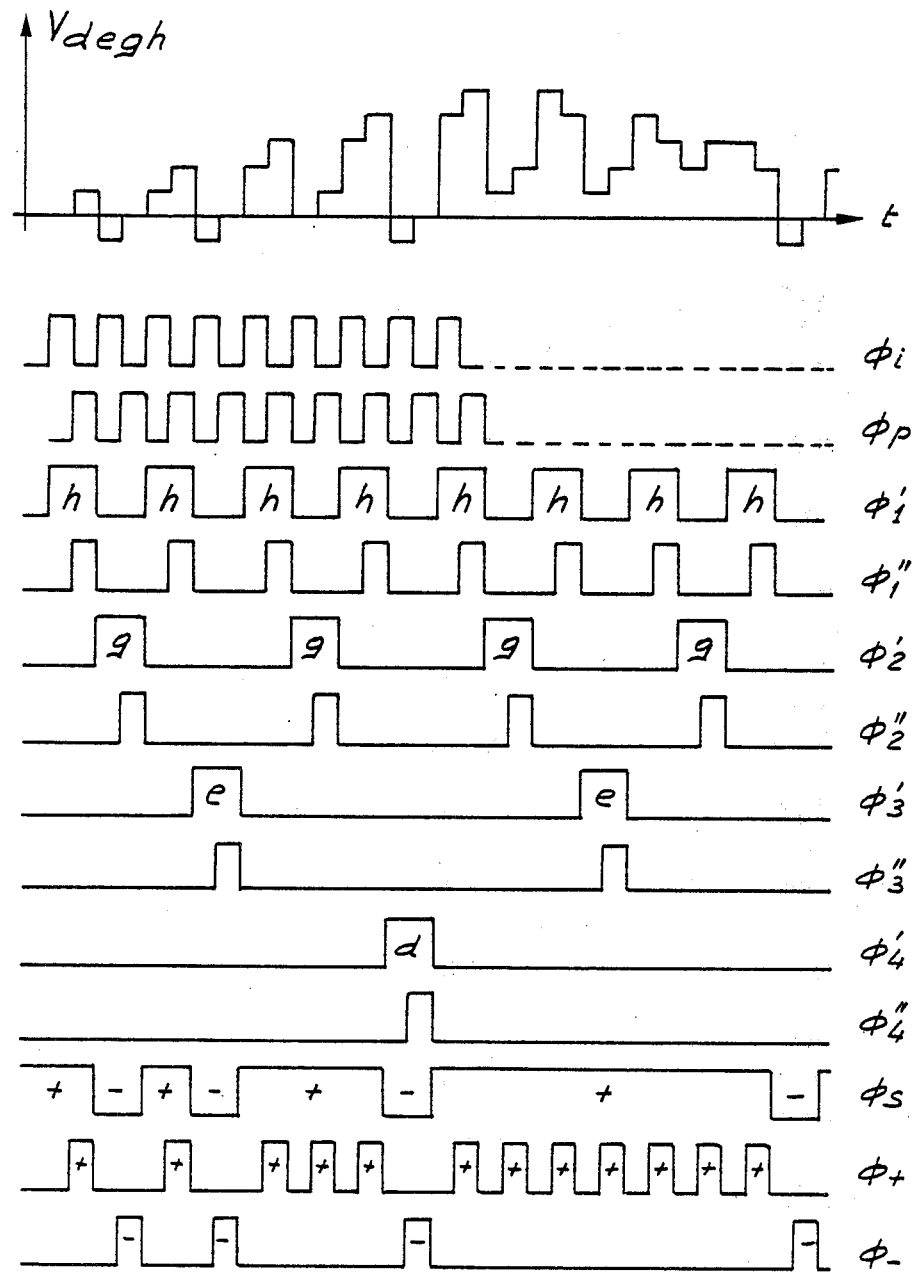
FIG. 10b is a diagram of control signals for this circuit.

The first line of FIG. 10b shows a possible form of the multiplexed signal Vdegh applied to the input $E_{10}$ of the circuit. In this figure, the signals $\phi_p$ and $\phi_i$, already described, are shown. The multiplexing signals $\phi'_1$ to $\phi'_4$ have already been described. The signals $\phi''_1$, $\phi''_2$, $\phi''_3$ and $\phi''_4$ are defined in the following manner:

$$\phi''_1 = \phi'_1 \cdot \phi_p;\ \phi''_2 = \phi'_2 \cdot \phi_p;$$

$$\phi''_3 = \phi'_3 \cdot \phi_p \text{ and } \phi''_4 = \phi'_4 \cdot \phi_p.$$

In other words, the signals $\phi''_1$ to $\phi''_4$ correspond to the portion of the signals $\phi'_1$ to $\phi'_4$ which occur at the same time as the signal $\phi_p$. In addition, it should be noted that the signal $\phi''_1$ has a logical level 1, that is to say an active level for each period during which the signal Vdegh contains a wave form corresponding to the channel h of the filter circuit. The same applies to the signal $\phi''_2$ and the channel g etc. These signals $\phi''_1$ to $\phi''_4$ are applied to the switches $S_{17}$ to $S_{20}$ respectively. FIG 10b likewise explains how the signals of the signs $\phi_+$ and $\phi_-$ are formed. The signals $\phi_s$ appears at the output of the comparator 74. The comparator emits a signal having the level $+1$ if its input receives a signal of more than zero, and a signal having the level 0 in the other case. The signal $\phi_+$ is the part which is common to the signals $\phi_p$ and $\phi_s$, while the signal $\phi_-$ is the part which is common to the signals $\phi_s$ and $\phi_p$. The signals $\phi''_1$ to $\phi''_4$ are applied to the switches $S_{17}$ to $S_{20}$ respectively. The signal $\phi_i$ is applied to the switches $S_{10}$, $S_{11}$ and $S_{13}$, the signal $\phi_+$ to the switches $S_{15}$ and $S_{12}$ and lastly the signal $\phi_-$ to the switches $S_{14}$ and $S_{16}$.

The manner in which the circuit of FIG. 10a functions is as follows:

At each instant when the level 1 of the signal $\phi_i$ is applied to the switches $S_{10}$, $S_{11}$ and $S_{13}$, the capacitor $C_{17}$ stores a charge corresponding to the value of the signal Vedgh present at the input $E_{10}$ at these instants. Simultaneously, the corresponding signal $\phi_s$ is acted upon by the polarity detector 74. At the instant when the logical level 1 following the signal $\phi_p$ appears, the switches $S_{10}$, $S_{11}$, and $S_{13}$ are open and the signal $\phi_+$ or $\phi_-$ is delivered at the output of the gate 76 or 78 depending upon the sign of Vdegh. This signal $\phi_+$ or $\phi_-$, when the switches $S_{12}$ and $S_{15}$ or $S_{14}$ and $S_{16}$ close, either connects the input $E_{11}$ to the line 84 and the point l to earth or connects the input $E_{11}$ to earth and the point l to the line 84. At the same time, one of the control signals $\phi''_1$ to $\phi''_4$ exhibits a logical level 1. That one of the switches $S_{17}$ to $S_{20}$ which corresponds to this signal is therefore closed and the charge contained in the capacitor $C_{17}$ is transferred to the capacitor corresponding to the closed switch. Moreover, because of the action of the signal $\phi_+$ and $\phi_-$, the charge is transferred with its sign.

If, for example, the signal $\phi''_3$ exhibits the logical level 1, then the switch $S_{19}$ is closed and the charge is transferred to the capacitor $C_{20}$. This capacitor corresponds to the channel e as does indeed the signal $\phi''_3$.

According to the same process of operation, the charges corresponding respectively to the channels h, g, e and d are stored, together with their sign, in the capacitors $C_{18}$, $C_{19}$, $C_{20}$ and $C_{21}$. The voltages at the terminals of the capacitors $C_{18}$ to $C_{21}$ are therefore representative of the means values $\overline{V}h$, $\overline{V}g$, $\overline{V}f$ and $\overline{V}e$ respectively of the wave forms of the signal applied to the input of the filter circuit for the various different filter channels h, g, e and d.

It is apparent that the circuit of FIG. 10a also effects the de-multiplexing of the multiplexed signal delivered by the filter sub-assembly 4. A similar circuit is associated with the sub-assembly 2.

Figure 11A:
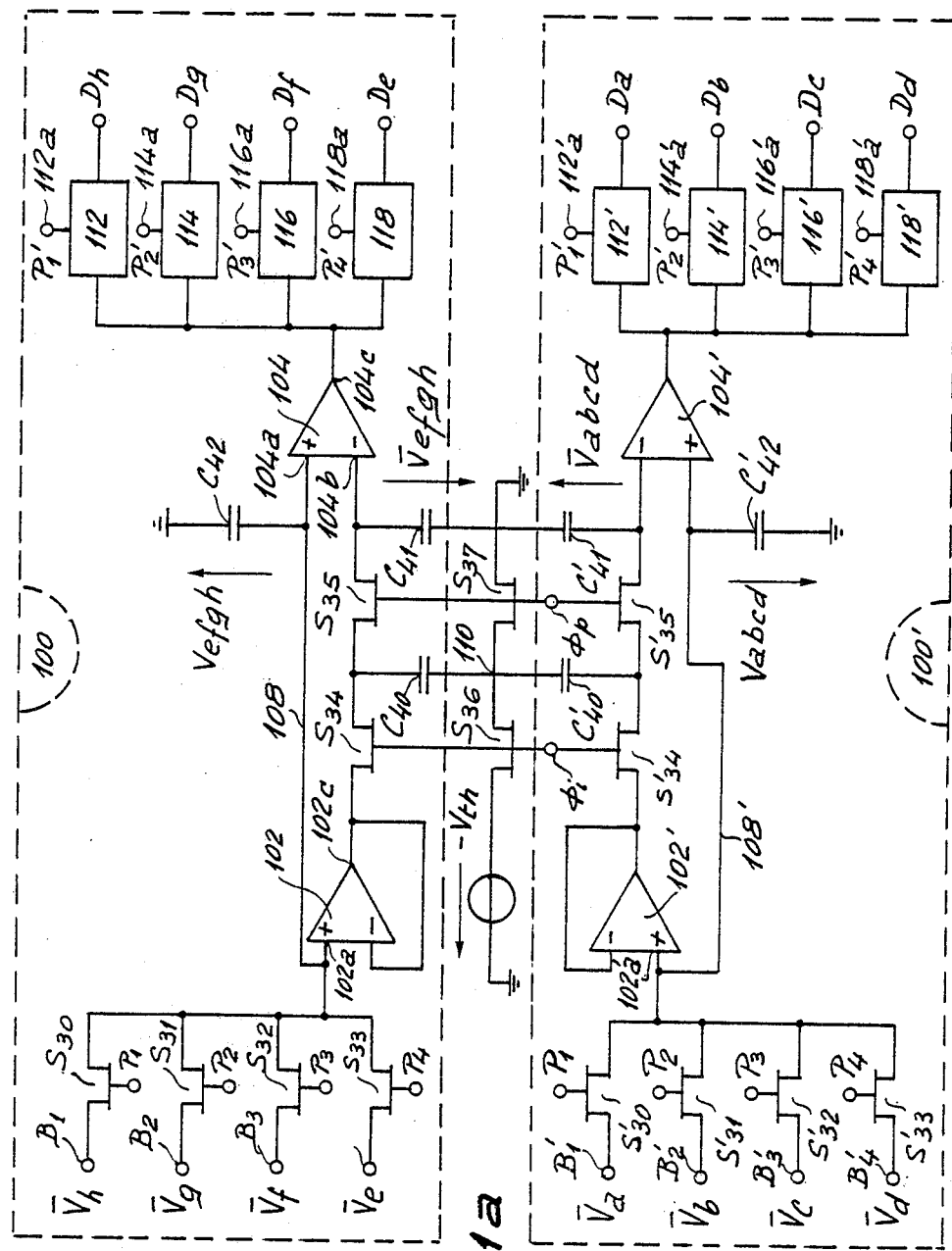
FIG. 11a shows a diagram of a circuit for comparing signals delivered by the circuit of FIG. 10a with a threshold.

Finally, the threshold-comparison circuit is shown in FIGS. 11a. This circuit enables the mean signal value corresponding to one filter band to be compared with the mean value of the signal relating to several filter bands, this value being increased by an offset voltage $V_{th}$.

The complete circuit comprises two sub-assemblies: the sub-assembly 100 which deals with the mean signals $\overline{V}h$, $\overline{V}g$, $\overline{V}f$ and $\overline{V}e$ corresponding to the channels e to h and the sub-assembly 100' which deals with the signals Vd, Vc, Vb and Va corresponding to the channels a to d.

The sub-assembly 100 comprises an amplifier 102 to direct input 102a of which is connected by switches $S_{30}$ to $S_{33}$ to input terminals $B_1$ to $B_4$. The output 102c of the amplifier 102 is connected by a line 106 to the inverting input 104b of a comparator 104. The line 106 contains switches $S_{34}$ and $S_{35}$ which are comprised for example by MOS transistors. In additon, the input 102a of the amplifier 102 is directly connected by a line 108 to the direct input 104a of the comparator 104. A capacitor $C_{42}$ is connected between earth and the input 104a. This sub-assembly 100 also comprises capacitors $C_{40}$ and $C_{41}$ connected in parallel between the line 106 and a line 110 which is common to the two sub-assemblies. Finally, the output 104c of the comparator 104 is connected to the inputs of four memory latches 112, 114, 116 and 118 provided with control inputs 112a, 114a, 116a and 118d. The line 110 is fed by a source of a voltage $-V_{th}$ source and contains the switches $S_{36}$ and $S_{37}$ which enable the $V_{th}$ source of the capacitors $C_{40}$ and $C_{41}$ to be isolated. It is obvious that the voltage $-V_{th}$ may either be fixed or be dependent on the total value of the voltages applied to the eight inputs of the sub-assemblies 100 and 100'.

The arrangement of the sub-assembly 100' is exactly the same as that of the sub-assembly 100. The elements of this sub-assembly bear the same references as the corresponding elements of the sub-assembly 100, but are distinguished by "prime" suffixes. All the capacitors $C_{40}$; $C_{42}$ and $C'_{40}$; $C'_{42}$ have a value of 1 pF, while $C_{41}$ and $C'_{41}$ have a value of 10 pF.

The signal $\phi_i$, already described, is applied to the control inputs of the switches $S_{34}$, $S'_{34}$, and $S_{36}$, while the signal $\phi_p$, also already described is applied to the control inputs of the switches $S_{35}$, $S'_{35}$ and $S_{37}$.

Figure 11B:
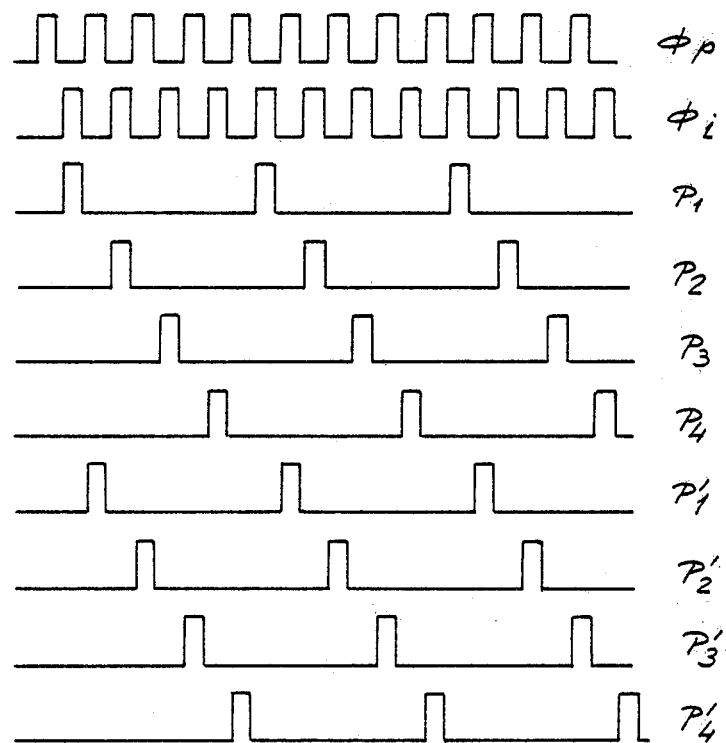
FIG. 11b is a diagram of the control signals of this circuit.

The multiplexing signals $P_1$ to $P_4$ applied to the switches $S_{30}$ to $S_{33}$ and $S'_{30}$ to $S'_{33}$ are represented in FIG. 11b. The same is true for the multiplexing signals $P'_1$ to $P'_4$ which are applied to the control inputs 112a to 118a of the latches 112 to 118.

As can be seen in FIG. 11b, the signal pulses $P_1$ to $P_4$ are coincident with signal pulses $\phi_1$, while the signal pulses $P'_1$ to $P'_4$ are coincident with signal pulses $\phi_p$. Moreover, the signals $P_1$ to $P_4$ and $P'_1$ to $P'_4$ are of the same frequency. Finally, the signals $P_1$ to $P_4$ are phase-shifted with respect to one another by a period equal to the frequency of the signals $\phi_i$ and $\phi_p$. The same applies to the signals $P'_1$ to $P'_4$.

The operation of the circuit of FIG. 11a is as follows: the signals $\overline{V}h$ to $\overline{V}e$ are applied to the terminals $B_1$ to $B_4$ of the sub-assembly 100, while the signals $\overline{V}d$ to $\overline{V}a$ are applied to the terminals $B'_1$ to $B'_4$ of the sub-assembly 100'. At each instant when a pulse of the signal $\phi_i$ appears, one of the signals $P_1$ to $P_4$ likewise produces a pulse which closes one of the switches $S_{30}$ to $S_{33}$ and one of the switches $S'_{30}$ to $S'_{33}$. The signal $\phi_i$ closes the switches $S_{34}$, $S'_{34}$ and $S_{36}$. The capacitor $C_{40}$ then has at this instant on-terminal at the voltage $\overline{V}f$ and the other terminal at the offset voltage $-V_{th}$. Similarly, the capacitor $C'_{40}$ has, at this instant, one terminal at the voltage $\overline{V}c$ and the other terminal at the voltage $-V_{th}$. This capacitor therefore acquires the corresponding charge. In addition, the capacitor $C_{42}$ has, with each multiplexing pulse, a charge corresponding to the wave form of the signal Vefgh associated with the multiplexing signal $P_1$ to $P_4$ which exhibits a logical level 1 (in the example the signal Phd 3). The capacitor $C_{42}$ therefore has a voltage representative of $\overline{V}f$. When the next pulse of the signal $\phi_p$ appears, the switches $S_{35}$, $S_{37}$ and $S'_{35}$ are closed, while the switches $S_{34}$, $S'_{34}$ and $S_{36}$ are open. The charges contained in the capacitors $C_{40}$ and $C'_{40}$ are transferred to the capacitors $C_{41}$ and $C'_{41}$ respectively. These new charges become added to the charge already contained in the capacitors $C_{41}$ and $C'_{41}$. There are, therefore, at the terminals of the capacitors $C_{41}$ and $C'_{41}$ voltages which correspond respectively to the mean signal value Vhgfe and Vdcba and which bear the reference Vhgfe and Vdcba.

When the signal $P'_3$ is applied to the control input of the latches 116 and 116', the logical comparison signals Df and Dc are present at the outputs of the latches 116 and 116'. The signal has the level 1 if the voltage Vf or Vc, is greater than the comparison voltage Vefgh or Vabcd, and the level 0 in the opposite case. The same applies of course to the other channels.

This circuit has the advantage of being multiplexed. Consequently, only one reference voltage comparator is necessary.

It follows from the preceding description that the invention has numerous advantages by comparison with the prior art techniques. In particular, the multi-channel filter makes possible a reduction in the number of amplifiers employed as well as a reduction in the current consumption of the filter. It also enables integration to be facilitated by the use of switch-controlled capacitors and the reduction of the number of complicated components such as amplifiers.

The filter is particularly well adapted for use in an integrated device of small dimensions, since it makes possible a reduction in the size of the integrated circuit and above all a reduction in the consumption of electrical energy.

It is apparent that modifications and changes may be made in the operation and structure of the invention as described above without departing from the scope of the invention. The description has been made only by way of example, and is not to be taken as limiting the invention.

What is claimed is:

1. An apparatus for processing a variable electrical signal by multiplexing with n processing channels, having a processing unit comprising a first amplifier; a plurality of charge-storing feedback components connected in parallel, the said charge-storing components consisting of n first processing elements each including a multiplexing switch and a charge-storing capacitor connected in series; a first charge-carrying component connected between the input of the said apparatus and the input of the said first amplifier, said first charge-carrying component including a single charge-transferring capacitor and at least two contact-breaking switches; means for providing the control signals including means for providing n periodic multiplexing signals each comprising an alternating succession of active and inactive levels, one of these multiplexing signals having a period shorter than that of the other multiplexing signals, the other signals of longer period having, taken as a whole, at most one active level between two consecutive active levels of the shorter period signal, and means for producing an alternation of the active levels of a switching signal occurring during the inactive levels of the other switching signal, each switching signal having an active level during each active level of the multiplexing signals, means for applying a multiplexing signal to each multiplexing switch; and means for applying switching signals to each contact breaking switch.

2. An apparatus according to claim 1, in which the said multiplexing signals all have different periods, and the periods of the various different signals of longer period are equal to the period of the signal of shorter period multiplied by $2^p$(p=1 to n−1).

3. An apparatus according to claim 1 in which the said processing is a filtering with n filter bands, comprising in addition a second charge-carrying-transferring capacitor connected between two contact-breaking switches; a second amplifier the input of which is connected to the output of the first amplifier via a third charge-carrying component including a single charge-transferring capacitor and at least one first and one second contact-breaking switch the said second amplifier having a feedback connection of n second processing elements, in parallel, each including a storage capacitor and a multiplexing switch connected in series, the output of the said second amplifier being connected to the first charge-carrying component; means for applying one of the multiplexing signals to each switch of the n second processing elements; and means for applying the said switching signals to the switches of the said second and third charge-carrying components, the said first amplifier delivering at its output a multiplexed signal constituted by a succession of wave forms of the variable signal filtered according to the said band pass ranges.

4. An apparatus according to claim 3, in which the said n band pass ranges are phase-displaced by one octave, the capacitors of the first and second processing elements all being of equal capacitance.

5. An apparatus according to either of claims 3 and 4, in which the second charge-carrying component includes in addition a supplementary charge-transferring capacitor, and a supplementary contact-breaking switch, the two contact-breaking switches being connected in series between the input and the output of the said first amplifier and being interconnected at a common point, the said charge-transferring capacitor being connected between the said common point and earth, the said supplementary contact-breaking switch and the said supplementary charge-transferring capacitor being connected in series between the said common point and earth.

6. An apparatus according to any of claims 3 to 4, in which the said third charge-carrying component comprises in addition first and second supplementary contact-breaking switches, the said first contact-breaking switch being connected between the output of the first amplifier and the first electrode of the said charge-transferring capacitor, the said second contact-breaking switch being connected between the input of the said second amplifier and the second electrode of the said charge-transferring capacitor, the said first and second supplementary contact-breaking switches being connected between earth and the first and second electrodes respectively of the said charge-transferring capacitor, the said first contact-breaking switch and the said supplementary contact-breaking switch being controlled by that one of the switching signals of which the active level appears first, the second switch and the said second supplementary contact-breaking switch being controlled by the other switching signal.

7. An apparatus according to claim 3 and further comprising a circuit for demultiplexing the multiplexed signal delivered by the said first amplifier and for determining the rectified means value of the successive wave forms corresponding to the several different filter channels, the said circuit including means for detecting the sign of each wave form, first means for storing the values of successive wave forms, n second means for storing the mean values of the said waveforms, n demultiplexing switches for transferring the value of the said first storage means to the second storage means according to its sign; and means for producing n periodic demultiplexing signals applied to the said switches in order to close the said switch which corresponds to the filter channel of the wave form applied to the input of the said demultiplexing circuit.

8. An apparatus according to claim 7, in which the said storage means are capacitors.

9. An apparatus according to claim 7, in which the said n demultiplexing signals exhibit respectively active levels which are the same as those of the said multiplexing signals, but are of shorter duration.

10. An apparatus according to any of claims 7 to 9, further comprising a comparator circuit for comparing n input signals with a threshold, the said comparator circuit comprising n inputs for receiving each of n signals to be compared; n switches for storing successively the value of each signal in a first capacitor; switching means for transferring the voltage of the said first capacitor to a second storage capacitor; means for comparing the voltage of the said second capacitor with each of the said input signals; means for transferring the result of the comparison to one among n stores, each store being associated with a respective input signal; means for producing n multiplexing signals controlling the n switches; and means for producing n demultiplexing signals controlling the said stores so as to control the transfer of the said comparison to one of the said stores.

* * * * *